US008446210B2

(12) United States Patent
Liu

(10) Patent No.: US 8,446,210 B2
(45) Date of Patent: May 21, 2013

(54) ELECTRONIC FUSE SYSTEM

(75) Inventor: Kai-Yin Liu, Kao Hsiung (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 13/082,072

(22) Filed: Apr. 7, 2011

(65) Prior Publication Data

US 2011/0248775 A1 Oct. 13, 2011

(30) Foreign Application Priority Data

Apr. 9, 2010 (TW) ............................... 99111060 A

(51) Int. Cl.
*H01H 37/76* (2006.01)
*G01R 31/07* (2006.01)

(52) U.S. Cl.
USPC ........................................................ 327/525

(58) Field of Classification Search
None
See application file for complete search history.

(56) References Cited

U.S. PATENT DOCUMENTS 7,129,769 B2 10/2006 Dixon et al.
7,242,239 B2 * 7/2007 Hanson et al. ................ 327/525
7,706,202 B2 * 4/2010 Obayashi et al. .......... 365/225.7
2009/0079439 A1 3/2009 Kuo

* cited by examiner

*Primary Examiner* — Lincoln Donovan
*Assistant Examiner* — Terry L Englund
(74) *Attorney, Agent, or Firm* — Muncy, Geissler, Olds & Lowe, PLLC

(57) ABSTRACT

An electronic fuse system includes: a pad, an electronic fuse circuit, a first switch circuit, and a control circuit. The pad is used for receiving a reference voltage. The electronic fuse circuit is used for changing a voltage level when a current signal passes. The first switch circuit is coupled between the pad and the electronic fuse circuit, for controlling the first switch circuit to be disabled or enabled according to a switch control signal. The control circuit, coupled to the first switch circuit is for transferring the switch control signal according a control signal and a lock signal.

8 Claims, 4 Drawing Sheets

ELECTRONIC FUSE SYSTEM

BACKGROUND OF THE INVENTION (a) Field of the Invention

The present invention relates to an electronic fuse system. More specifically, this invention relates to an electronic fuse system preventing from false action.

(b) Description of the Related Art

Generally, the melting status of a fuse can be decided at initial setting of the electronic fuse system. In other words, a user can decide whether melts down the fuse to change the electronic fuse system voltage level and output different outputs at initial setting.

However, at the transient time of system turning on or turning off, the instantaneous current flows the fuse will be large that could make the fuse melting. Therefore, if the output signal changed by false action, the electronic fuse system cannot adjust system according to the demand of a user.

BRIEF SUMMARY OF THE INVENTION

One object of the present invention is to provide an electronic fuse system that can prevent false action to solve the fore-mentioned problem.

One embodiment of the invention discloses an electronic fuse system. The electronic fuse system includes: a pad, an electronic fuse circuit, a first switch circuit and a control circuit. The pad is used of receiving a reference voltage. The electronic fuse circuit is used of changing a voltage level when a current signal passes. The first switch circuit coupled between the pad and the electronic fuse circuit to control the first switch circuit disabled or enabled according to a switch control signal. The control circuit, coupled to the first switch circuit to transfer the switch control signal according a control signal and a lock signal. Wherein, when the lock signal is enabled, the control signal is unable to control the control circuit to turn on the first switch circuit.

Therefore, the present invention can avoid the false action making the erroneous output voltage transient which is caused by the over current through the electronic fuse.

DETAILED DESCRIPTION OF THE INVENTION

Figure 1:
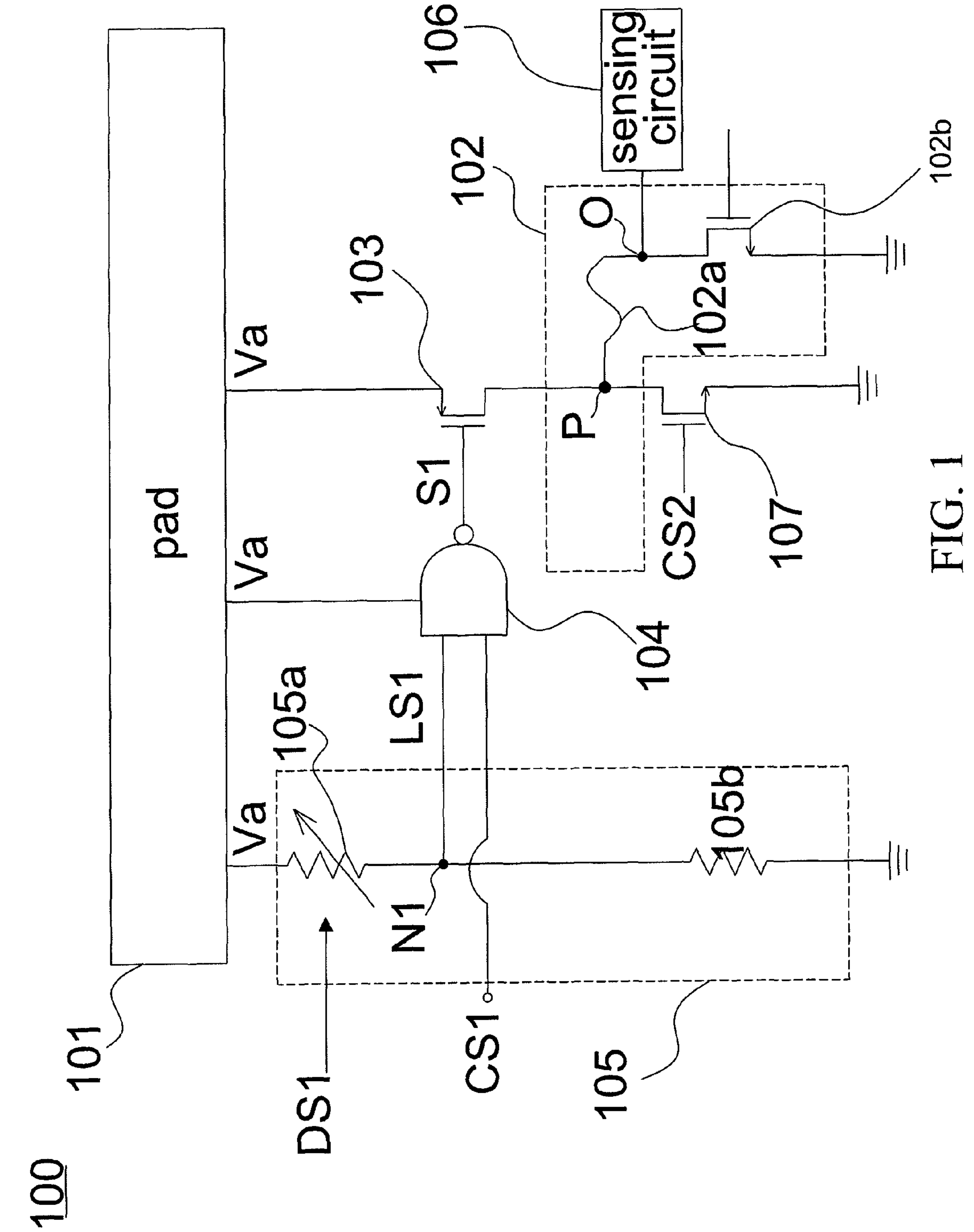
FIG. 1 shows a schematic diagram illustrating an electronic fuse system according to one embodiment of the invention.

Please refer to FIG. 1 which shows a schematic diagram illustrating an electronic fuse system according to one embodiment of the invention. As shown in FIG. 1, the electronic fuse system 100 comprises a pad 101, an electronic fuse circuit 102, a switching circuit 103 and a control circuit 104.

The pad 101 is used of receiving and transporting a reference voltage. The switching circuit 103 couples between the pad 101 and the electronic fuse circuit 102. The switching circuit 103 determines whether a current signal I flows through the electronic fuse circuit 102 or not according to switch control signal S1 which controls the conduction. The control circuit 104, which is determined to output the switch control signal S1 according to a control signal CS1 and a locking signal LS1.

Therefore, electronic fuse has low impedance so that an electronic fuse will be melted when the electronic fuse circuit 102 receives a higher current signal I, and then the electronic fuse circuit 102 forms an open circuit so that the electronic fuse system 100 will change the status.

The electronic fuse system 100 determines the switching circuit 103 be conducted or not according to the switch control signal S1. When the switching circuit 103 is conducted, the current signal I passes through the electronic fuse circuit 102 from the pad 101 so that changes the output voltage level of the electronic fuse system 100 changes, and thereby achieve the purpose of the system adjusting.

It is noted that, in one embodiment of present invention, the control circuit 104 can be a NAND Gate, and the switching circuit 103 can be a PMOSFET. However, the present invention should not be limited as this embodiment.

As shown in FIG. 1, the electronic fuse system 100 further comprises a locking signal generating circuit 105 which generates the locking signal LS1 and comprises a adjustable resistance 105*a* and a reference resistance 105*b*.

Because adjustable resistance 105*a* is coupled in series with the reference resistance 105*b* and couples to the pad 101 to receive the reference voltage Va. The control circuit 104 couples to a node N1 between the adjustable resistance 105*a* and the reference resistance 105*b* so that the voltage level of locking signal LS1 can be adjusted by controlling the resistance of the adjustable resistance 105*a* via signal DS1.

When locking signal generating circuit 105 is unlocked, the user can adjust signal DS1 that making the resistance of adjustable resistance 105*a* far smaller than the resistance of the reference resistance 105*b*. Accordingly, the voltage level of locking signal LS1, which outputs from the node N1, will be rising approximate to reference voltage Va. In this embodiment, the control circuit 104 is a NAND gate so that the function of control circuit 104 is equivalent to an inverter when locking signal LS1 substantially equals to logic 1.

In the present embodiment, the electronic fuse system 100 further includes a sensing circuit 106 and a switching circuit 107. Moreover, the electronic fuse circuit 102 includes a fuse 102*a* and a transistor 102*b*; and the transistor 102*b* and the switching circuit 107 can be implemented by a NMOSFET.

As shown in FIG. 1, one terminal of fuse 102*a* is coupled with the switching circuit 103 and 107, another terminal is coupled to transistor 102*b* in series. The switching circuit 103, 107 and the fuse 102*a* are commonly coupled to a node P. The sensing circuit 106 couples to a node O between fuse 102*a* and transistor 102*b*, and the sensing circuit 106 receives the voltage level of node O.

When locking signal generating circuit 105 is unlocked (the locking signal LS1 is disabled, ex: locking signal LS1 is logic 1 in this embodiment) and fuse 102*a* is determined no need to melt, in this situation, the control signal CS1 need keeping at low voltage level. Therefore, the control circuit 104 outputs the switch control signal S1 corresponding the high voltage level to switching circuit 103. Then the switching circuit 103 is turned-off and the control signal CS2 enables the switching circuit 107 to connect ground. In one embodiment, the sensing circuit 106 can determine whether the fuse 102*a* is melted or not by comparing the impedance of fuse 102*a* and a compared resistance (not shown). Because the switching circuit 107 is enable, sensing circuit 106 will sense a low voltage level at node O.

When it is necessary to melt the fuse 102*a*, switching circuit 103 and transistor 102*b* are enabled and form a loop. Larger current signal I will flow through switching circuit 103 and electronic fuse circuit 102 from pad 101 to melt the fuse 102*a*.

After fuse 102*a* is melted down, transistor 107 is enabled so that the impedance of the node O of sensing circuit 106 will be regarded as infinity. It should be noted that, control circuit 104 is a NAND gate, however, logic 1 or 0 of locking signal LS1 can be controlled according to voltage divider theorem by adjusting the resistance value of adjustable resistance 105*a*. Therefore, switch control signal S1 can prevent false action through both locking signal LS1 and control signal CS1.

The locking signal generating circuit 105 (locking signal LSI is in enabling status, ex: locking signal LSI is logic 1 in this embodiment), impedance of the adjustable resistance 105*a* is more greater than the reference resistance 105*b*, which is adjusted according to the adjusting signal DS1. It is understood that the voltage level of the locking signal LS1 which outputted from the node N1 will be fallen. The voltage level of the node N1 is reduced near to zero, whether the switch control signal S1 is at high voltage level or not, the voltage level outputted from the control circuit 104 is at high voltage level so that the switching circuit 103 will not be conducted. The current signal I cannot pass through the switching circuit 103 and the fuse 102*a* will not be melted.

It is to be noted that, if locking signal LS1 generated by the locking signal generating circuit 105 is high voltage level, user still can adjust the control signal CS1 to control the output of control circuit 104 and thereby enable or disable switching circuit 103 to melt fuse 102*a* or not. Contrarily, if locking signal LS1 generated by the locking signal generating circuit 105 is low voltage level, no matter what the voltage level of control signal CS1 is, the output of control circuit 104 will always be high voltage level and switching circuit 103 is disabled.

Therefore, this invention can prevent from node O unpredictably changing voltage status to erroneously melt down fuse 102*a* due to the false action occurred at switching circuit 103 and the transistor 102*b*, which caused by the transient time when electronic fuse system 100 power-on or power-off.

Figure 2A:
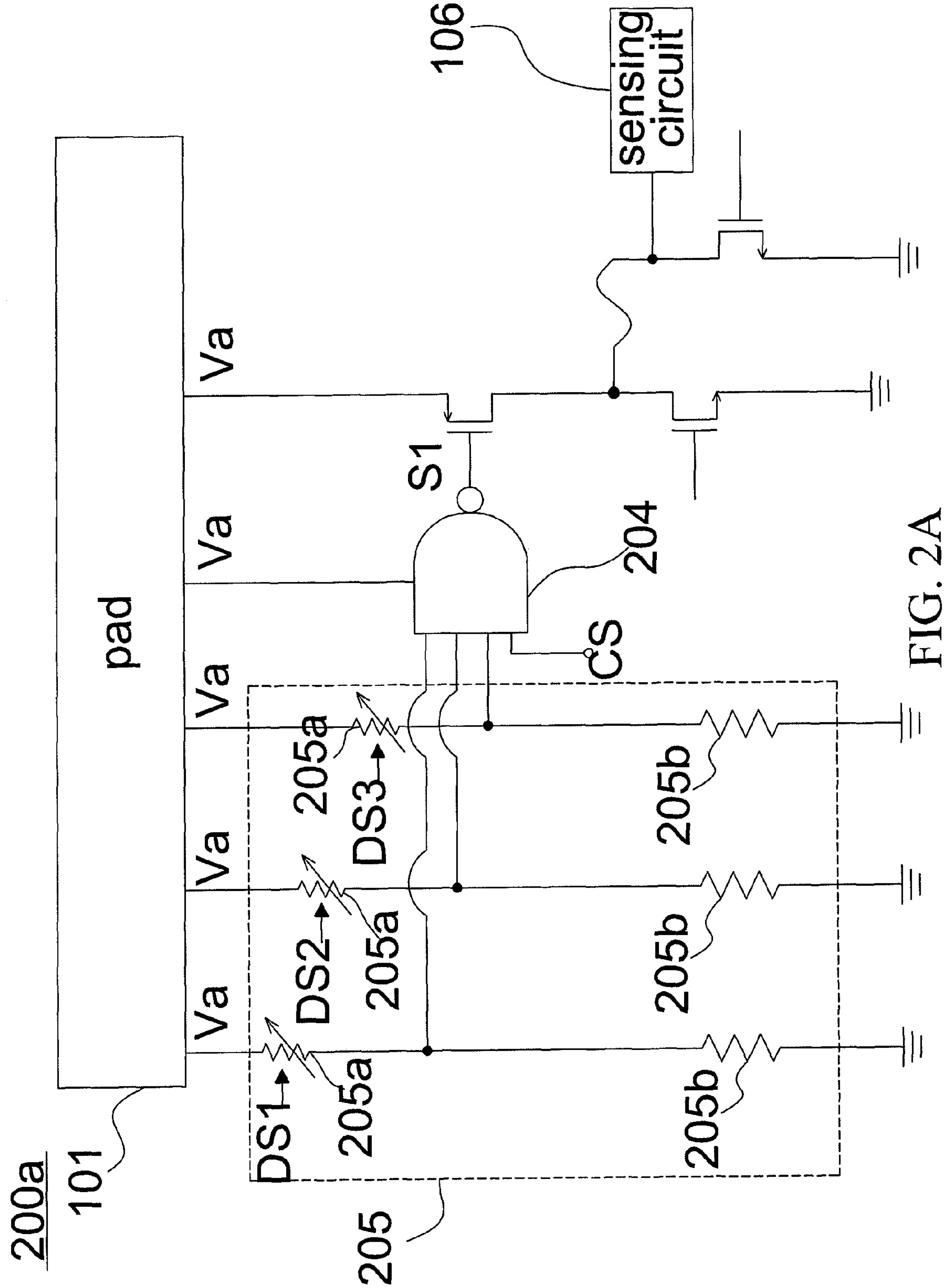
FIG. 2A shows a schematic diagram illustrating an electronic fuse system according to one embodiment of the invention.

Please refer to FIG. 2A, which shows a schematic diagram illustrating an electronic fuse system 200*a* according to one embodiment of the invention. The difference between the electronic fuse systems 200*a* and fuse systems 100 is locking signal generating circuit 205 including three adjustable resistances 205*a* and three reference resistances 205*b*. The structure and connection are shown in FIG. 2A.

Therefore, a user need to adjust three adjusting signals DS1, DS2, DS3 to make the impedance of the three adjustable resistances 205*a* more greater than the three reference resistances 205*b* so that the switch control signal S1 outputted from the control circuit 204 is low voltage level. To prevent the false action making fuse 102*a* being erroneously melted, which occurred at switching circuit 103 and transistor 102*b* the user only need to adjust one of the voltage level of adjusting signals DS1, DS2, DS3 to a low voltage level. Thus, the electronic fuse system 200*a* can prevent from the false action due to the voltage level of node O changing unpredictably by multiple level protection. In other words, the system can increase the locking probability to prevent from the problem that the system cannot get locked. Other operational principles are the same as aforementioned, detail description is omitted here for sake of brevity.

Figure 2B:
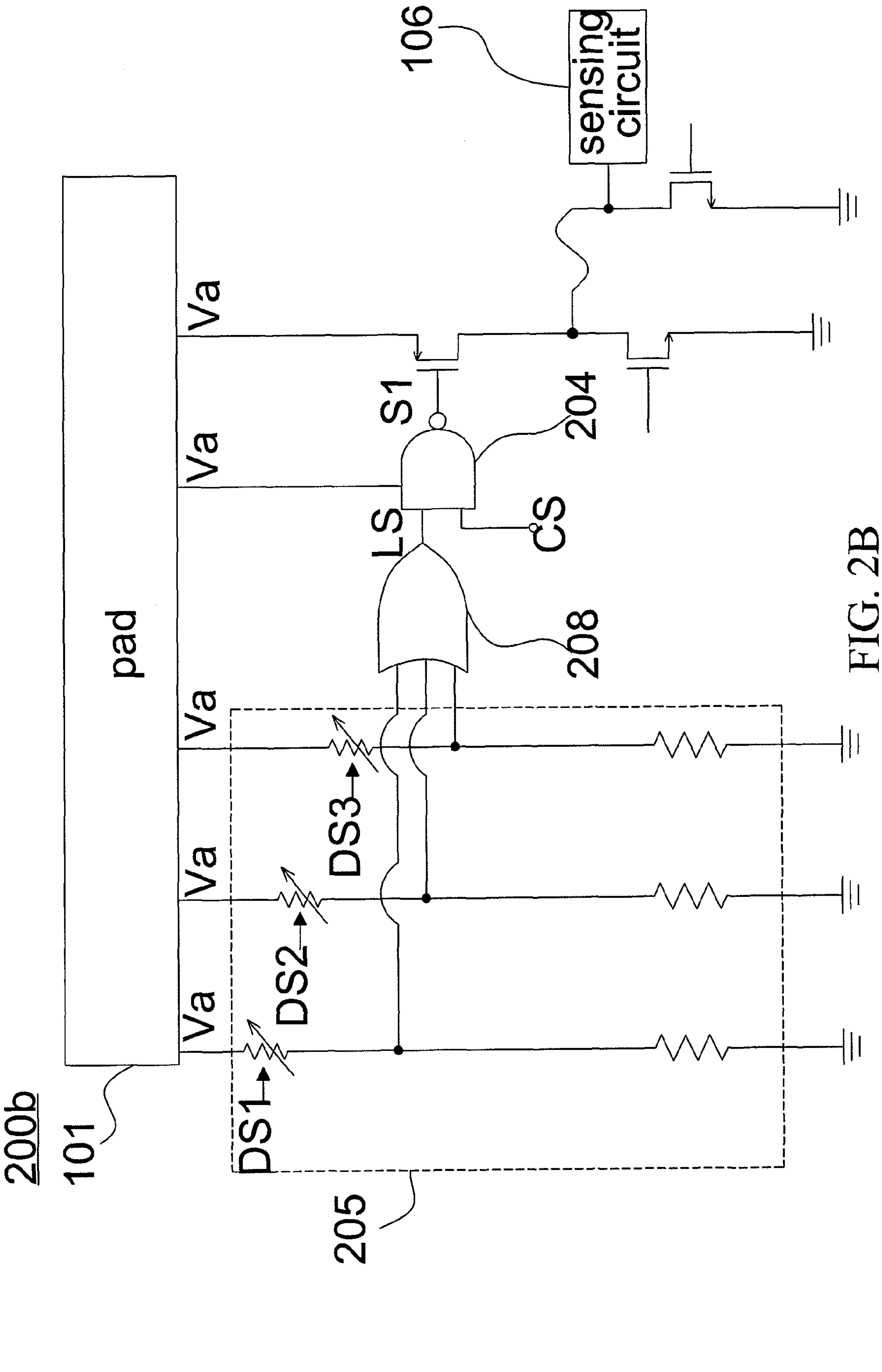
FIG. 2B shows a schematic diagram illustrating an electronic fuse system according to one embodiment of the invention.

Please refer to FIG. 2B, FIG. 2B shows a schematic diagram illustrating an electronic fuse system 200*b* according to one embodiment of the invention. The difference between the electronic fuse systems 200*a* and 200*b* is that the electronic fuse system 200*b* includes an OR gate 208. OR gate 208 couples to the locking signal generating circuit 205 and outputs the locking signal LS to the control circuit 204. The control circuit 204 output the switch control signal S1 according to locking signal LS and control signal CS.

In this embodiment, when one of adjusting signals DS1, DS2, DS3 is high voltage level, the locking signal LS outputted by OR gate 208 will be high voltage level. This embodiment comparison with electronic fuse systems 200*a* has a feature that this embodiment can prevent from the erroneously locking. Therefore, it is assumed that adjusting signals DS1, DS2, DS3 are controlled by three different users, when one of the three users would like to melt fuse 102*a*, it only need to make one of adjusting signals DS1, DS2, DS3 operated at high voltage level, no need to make all of adjusting signals DS1, DS2, DS3 operated at high voltage level Other operational principles are the same as aforementioned, detail description is omitted here for sake of brevity.

Figure 3:
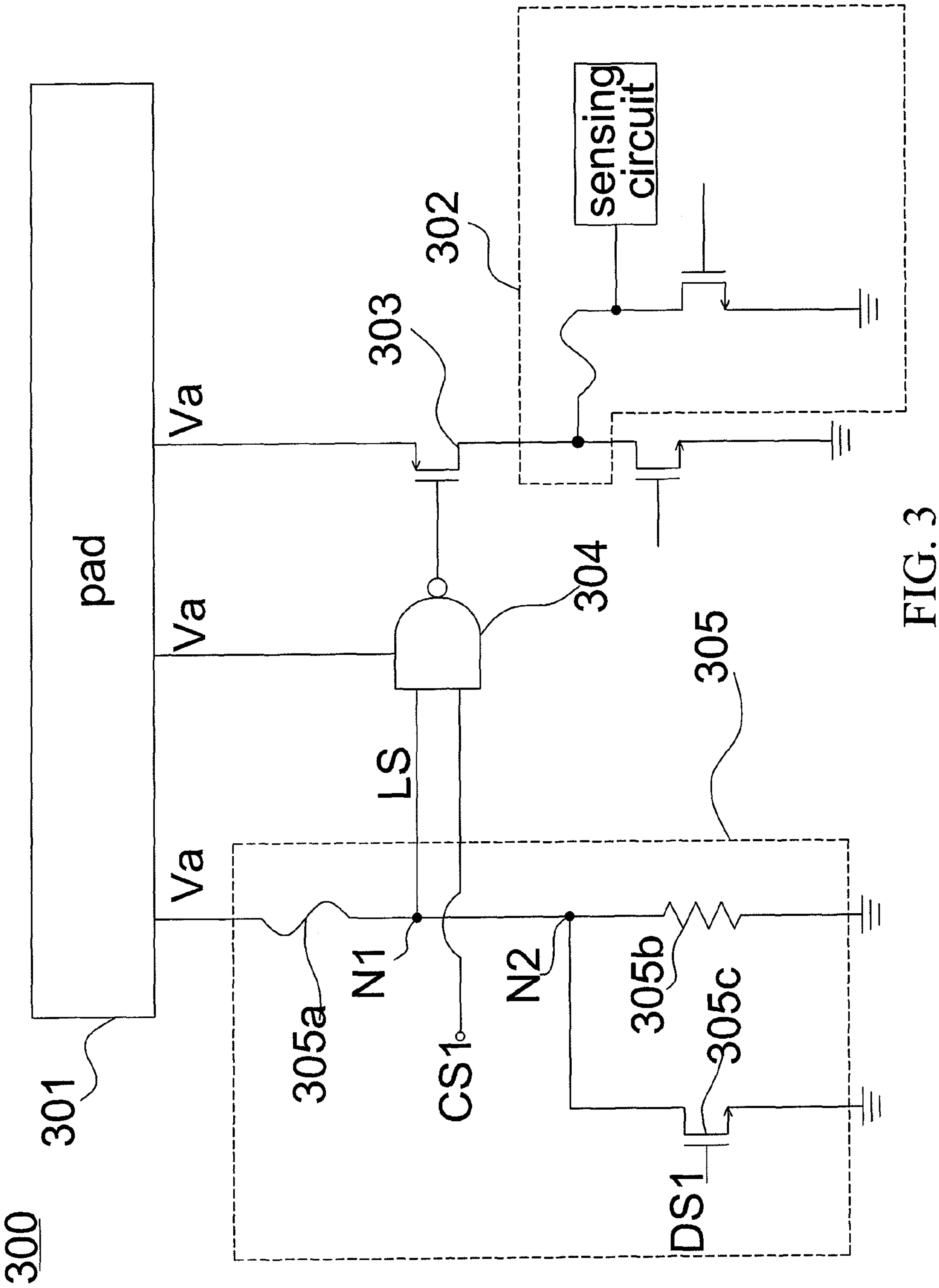
FIG. 3 shows a schematic diagram illustrating an electronic fuse system according to one embodiment of the invention.

Please refer to FIG. 3. FIG. 3 shows a schematic diagram illustrating an electronic fuse system according to one embodiment of the invention. As shown in FIG. 3, the electronic fuse system 300 comprises a pad 301, an electronic fuse circuit 302, a switching circuit 303 and a control circuit 304.

It is to be noted that, electronic fuse systems 300 and 100 have similar function, the difference is that locking signal generating circuit 305 includes a adjusting fuse 305*a*, a reference resistance 305*b* and a switching circuit 305*c*.

Adjusting fuse 305*a* couples reference resistance 305*b* in series, and couples to pad 301 and receives reference voltage Va; control circuit 304 couples to node N1 between adjusting fuse 305*a* and reference resistance 305*b*; switching circuit 305*c* couples to node N2 between adjusting fuse 305*a* and reference resistance 305*b*; and node N1 outputs locking signal LS. In this embodiment, node N1 and node N2 are substantially the same and switching circuit 305*c* is a NMOSFET.

When the initial value of adjusting signals DS1 is low voltage level, the switching circuit 305*c* is disabled. According to the voltage divider rule, the voltage level of node N1 will be very closed to reference Va when the impedance of adjusting fuse 305*a* more smaller than reference resistor 305*b*. Accordingly, locking signal LS is a high voltage level and the function of control circuit 304 is like a inverter.

When determine to lock locking signal generating circuit 305, user controls adjusting signals DS1 operated at high voltage level so that the switching circuit 305*c* can be enabled. The voltage level of node N1 will be pulled down to a low voltage level. Due to the cross voltage between adjusting fuses 305*a* is large and the resistance of adjusting fuses 305*a* is small, the current flows through adjusting fuses 305*a* will be very large to melt down the adjusting fuses 305*a*. Furthermore, the voltage of node N1 will keep at low voltage level and control circuit 304 will be locked.

Therefore, user can utilize adjusting signals DS1 to control the operation of switching circuit 305*c* so as to control the voltage level of locking signal LS, and also can make the voltage level of locking signal LS operating at low voltage level permanently by melting down adjusting fuses 305*a*. Other operational principles are the same as aforementioned, detail description is omitted here for sake of brevity.

In sum, this invention can prevent from the false action making the erroneous output voltage transient which caused by the over current through the electronic fuse, and thereby solve the problem of overall system could falling to control.

What is claimed is:

1. An electronic fuse system, comprising:

a pad, for receiving a reference voltage and outputting a current signal;

an electronic fuse circuit, melted down to change an output voltage level when the current signal passes through the electronic fuse circuit;

a first switch circuit, coupled between the pad and the electronic fuse circuit, for determining the current signal that is passed through the electronic fuse circuit according to a switch control signal; and a control circuit, coupled to the first switch circuit to output the switch control signal according to a control signal and a first locking signal;

wherein, the control signal cannot control the control circuit to allow conduction of the first switch circuit when the first locking signal is locking; the electronic fuse system further comprises a locking generating circuit to generate the first locking signal, which locks the control circuit or not; the locking generating circuit comprises:

a first adjustable resistance, coupled to the pad and receiving the reference voltage;

a first reference resistance, coupled to the first adjustable resistance in series, a first node between the first adjustable resistance and the first reference resistance outputs the first locking signal; a first terminal of the control circuit couples to the first node; and an impedance of the first adjustable resistance is adjusted according to a first adjusting signal to adjust a voltage level of the first locking signal.

2. The electronic fuse system according to claim 1 wherein the locking generating circuit further comprises:

a second adjustable resistance, coupled to the pad and receiving the reference voltage; and a second reference resistance, coupled to the second adjustable resistance in series, a second node between the second adjustable resistance and the second reference resistance outputs a second locking signal;

wherein, a second terminal of the control circuit couples to the second node; and an impedance of the second adjustable resistance is adjusted according to a second adjusting signal to adjust a voltage level of the second locking signal.

3. The electronic fuse system according to claim 2, wherein the first switch circuit is a PMOSFET.

4. The electronic fuse system according to claim 2, wherein the control circuit is a NAND gate.

5. An electronic fuse system, comprising:

a pad, for receiving a reference voltage and outputting a current signal;

an electronic fuse circuit, melted down to change an output voltage level when a the current signal passes through the electronic fuse circuit;

a first switch circuit, coupled between the pad and the electronic fuse circuit, for determining the current signal that is passed through the electronic fuse circuit according to a switch control signal; and a control circuit, coupled to the first switch circuit to output the switch control signal according to a control signal and a locking signal;

wherein, the control signal cannot control the control circuit to allow conduction of the first switch circuit when the locking signal is locking; and a locking generating circuit comprising:

an adjusting fuse, coupled to the pad and receiving the reference voltage;

a reference resistance, coupled to the adjusting fuse in series;

a second switch circuit, coupled to a node between the adjusting fuse and the reference resistance, the locking signal outputted from the node;

a first terminal of the control circuit couples to the node; and the second switch circuit is allowed to conduct to adjust a voltage level of the locking signal according to an adjusting signal.

6. The electronic fuse system according to claim 5, wherein the first switch circuit is a PMOSFET.

7. The electronic fuse system according to claim 6, wherein the second switch circuit is a NMOSFET.

8. The electronic fuse system according to claim 6, wherein the control circuit is a NAND gate.

* * * * *